(12) United States Patent
Hammad et al.

(10) Patent No.: US 11,721,826 B2
(45) Date of Patent: Aug. 8, 2023

(54) SOLID OXIDE FUEL CELL USING ZEOLITE-TEMPLATED CARBON AS ELECTROCATALYST

(71) Applicant: Saudi Arabian Oil Company, Dhahran (SA)

(72) Inventors: Ahmad D. Hammad, Dhahran (SA); Issam T. Amr, Al Khobar (SA); Yuguo Wang, Dhahran (SA); Georgios Lithoxoos, Dhahran (SA); Rashid M. Othman, Al Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 106 days.

(21) Appl. No.: 17/497,521

(22) Filed: Oct. 8, 2021

(65) Prior Publication Data

US 2023/0025861 A1 Jan. 26, 2023

(30) Foreign Application Priority Data

Jul. 14, 2021 (GR) ............................... 20210100468

(51) Int. Cl.
*H01M 8/1246* (2016.01)
*H01M 8/1231* (2016.01)
(Continued)

(52) U.S. Cl.
CPC ........... *H01M 8/1246* (2013.01); *C23C 16/26* (2013.01); *H01M 8/04007* (2013.01);
(Continued)

(58) Field of Classification Search
CPC ............ H01M 8/1246; H01M 8/1231; H01M 8/04007; H01M 8/04089; H01M 8/04701;
(Continued)

(56) References Cited

U.S. PATENT DOCUMENTS 1,511,001 A 10/1924 Padden
1,512,001 A 10/1924 Cerny
(Continued)

FOREIGN PATENT DOCUMENTS

EP 1808920 7/2007
EP 2673083 12/2013
(Continued)

OTHER PUBLICATIONS

Yang et al., "Effect of functionalization for carbon molecular sieve (CMS) synthesized using zeolite template on the incorporation of Pt nanoparticle and performance of the electrodes in PEMFC," Microporous and Mesoporous Materials, 2012, 152:148-156, 9 pages.

(Continued)

*Primary Examiner* — James M Erwin
(74) *Attorney, Agent, or Firm* — Fish & Richardson P.C.

(57) ABSTRACT

A solid oxide fuel cell assembly (SOFC) and a method for making the SOFC are provided. An exemplary method includes forming a functionalized zeolite templated carbon (ZTC). The functionalized ZTC is formed by forming a CaX zeolite, depositing carbon in the CaX zeolite using a chemical vapor deposition (CVD) process to form a carbon/zeolite composite, treating the carbon/zeolite composite with a solution comprising hydrofluoric acid to form a ZTC, and treating the ZTC to add catalyst sites. The functionalized ZTC is incorporated into electrodes by forming a mixture of the functionalized ZTC with a calcined solid oxide electrolyte and calcining the mixture. The method includes forming an electrode assembly, forming the SOFC assembly, and coupling the SOFC assembly to a cooling system.

20 Claims, 10 Drawing Sheets

(51) Int. Cl.
| | |
|---|---|
| *H01M 8/04007* | (2016.01) |
| *H01M 8/04089* | (2016.01) |
| *C23C 16/26* | (2006.01) |
| *H01M 8/04701* | (2016.01) |
| *H01M 8/12* | (2016.01) |

(52) U.S. Cl.
CPC ............ *H01M 8/04089* (2013.01); *H01M 8/04701* (2013.01); *H01M 8/1231* (2016.02); *H01M 2008/1293* (2013.01); *H01M 2300/0077* (2013.01)

(58) Field of Classification Search
CPC ............ H01M 2008/1293; H01M 2300/0077; C23C 16/26
USPC ..................................................... 429/484
See application file for complete search history.

(56) References Cited

U.S. PATENT DOCUMENTS

| | | | |
|---|---|---|---|
| 2,092,316 | A | 9/1937 | Lane |
| 3,487,484 | A | 1/1970 | Holmes |
| 4,855,820 | A | 8/1989 | Barbour |
| 5,944,195 | A | 8/1999 | Huang et al. |
| 7,842,200 | B2 | 11/2010 | Ehrman et al. |
| 2004/0202918 | A1 | 10/2004 | Mardilovich et al. |
| 2005/0241825 | A1 | 11/2005 | Burris, II et al. |
| 2006/0157239 | A1 | 7/2006 | Ramos et al. |
| 2011/0253373 | A1 | 10/2011 | Kumar et al. |
| 2016/0101407 | A1* | 4/2016 | Wang ............... B01J 20/324 502/416 |
| 2016/0320769 | A1 | 11/2016 | Deffenbaugh et al. |
| 2016/0351916 | A1 | 12/2016 | Birss et al. |
| 2018/0198150 | A1* | 7/2018 | Kim ............... H01M 8/1213 |
| 2019/0074142 | A1* | 3/2019 | Gartia ............... C30B 29/02 |
| 2020/0227779 | A1* | 7/2020 | Read ............... H01M 4/131 |
| 2021/0083249 | A1* | 3/2021 | Xiao ............... H01M 4/366 |
| 2021/0257658 | A1 | 8/2021 | Wachsman ......... H01M 10/058 |
| 2021/0313602 | A1* | 10/2021 | Kusano ............ H01M 8/04156 |

FOREIGN PATENT DOCUMENTS

| | | |
|---|---|---|
| JP | 5861492 | 2/2016 |
| WO | WO 2006044313 | 4/2006 |
| WO | WO 2008008409 | 1/2008 |

OTHER PUBLICATIONS

PCT International Search Report and Written Opinion in International Appln. No. PCT/US2022/073484, dated Nov. 10, 2022, 16 pages.

U.S. Appl. No. 17/450,406, Birss et al., filed Dec. 1, 2016.
U.S. Appl. No. 17/450,416, Hammad et al., filed Oct. 8, 2021.
U.S. Appl. No. 17/497,556, Hammad et al., filed Oct. 8, 2021.
Catalyst Preparation: Science and Engineering, Regalbuto, CRC Press, Taylor & Francis Group, 2007, 491 pages.
High-temperature Solid Oxide Fuel Cells: Fundamentals, Design and Applications, Singhal et al., Elsevier Science, 2003, pp. 7-16.
Kan et al., "Trends in electrode development for next generation solid oxide fuel cells," Journal of Materials Chemistry A, 2016, 4(46), 20 pages.
Kumar et al., "Hydrogen production by PEM water electrolysis—A review," Materials Science for Energy Technologies, 2019, 2:442-454, 13 pages.
Lu et al., "Zeolite-templated nanoporous carbon for high performance supercapacitors," Journal of Materials Chemistry A, 2018, 6:10388, 9 pages.
Marie et al., "Highly dispersed platinum on carbon aerogels as supported catalysts for PEM fuel cell-electrodes: comparison of two different synthesis paths," Journal of Non-Crystalline Solids, 2004, 350:88-96, 9 pages.
Marie et al., "Highly porous PEM fuel cell cathodes based on low density carbon aerogels as Pt-support: Experimental study of the mass-transport losses," Journal of Power Sources, May 2009, 190(2):423-434, 12 pages.
Marie et al., "Platinum supported on resorcinol-formaldehyde based carbon aerogels for PEMFC electrodes: Influence of the carbon support on electrocatalytic properties," Journal of Applied Electrochemistiy, 2007, 37:147-153, 7 pages.
Miao et al., "Revival of Zeolite-Templated Nanocarbon Materials: Recent Advances in Energy Storage and Conversion," Advanced Science, 2020, 7:2001335, 32 pages.
Ogungbemi et al., "Review of operating condition, design parameters and material properties for proton exchange membrane fuel cells," International Journal of Energy Research, Feb. 2021, 45(2):1227-1245, 19 pages.
Stadie et al., "Zeolite-Templated Carbon as an Ordered Microporous Electrode for Aluminum Batteries," ACS Nano 2017, 11:1911-1919, 9 pages.
Wang et al., "Hydrogen production by catalytic dehyrdrogenation of tetralin and decalin over stacked cone carbon nanotube-supported Pt catalysts," Energy & Fuels 2006, 20:2612-2615, 4 pages.
Wang et. al., "Pure hydrogen production by partial dehydrogenation of cyclohexane and methylcyclohexane over nanotube-supported Pt and Pd catalysts," Energy & Fuels, 2004, 18:1429-1433, 5 pages.
wikipedia.com [online], "Solid oxide electrolyzer cells," available on or before Aug. 6, 2020 via Internet Archive Wayback Machine URL<https://web.archive.org/web/20200806055040/https://en.wikipedia.org/wiki/Solid_oxide_electrolyzer_cell>, retrieved on Nov. 11, 2021, retrieved from URL <https://en.wikipedia.org/wiki/Solid_oxide_electrolyzer_cell>, 7 pages.

* cited by examiner

300

500

700

SOLID OXIDE FUEL CELL USING ZEOLITE-TEMPLATED CARBON AS ELECTROCATALYST

CROSS-REFERENCE TO RELATED PATENT APPLICATIONS

This application claims priority to Greek Application No. 20210100468 filed on Jul. 14, 2021.

TECHNICAL FIELD

The present disclosure is directed to enhancing the performance of solid oxide fuel cells by using zeolite-templated carbon (ZTC) as electrocatalyst.

BACKGROUND

Fuel cells are an alternative energy technology that generates energy directly from the oxidation of fuels, such as hydrogen, light hydrocarbons, or alcohols, among others. There are many types of fuel cells, but they all share a single common design and process: a negative electrode (an anode) and a positive electrode (a cathode) sandwiched around an electrolyte facilitate an electrochemical reaction to produce an electric current. The electrolyte is an ion conductor that moves ions either from the fuel to the air, such as hydrogen ions, or the air to the fuel, such as oxygen ions, to create electron flow. Electrolytes vary among fuel cell types, and depending on the electrolyte deployed, the fuel cells undergo slightly different electrochemical reactions, use different catalysts, run on different fuels, and achieve varying efficiencies.

Solid oxide fuel cells use a ceramic electrolyte that conducts oxide ions from the oxidizer, such as air, on the cathode side to the anode side. At the anode side the fuel combines with the oxide ions to form steam, carbon dioxide, or both. From the reaction, the fuel cell produces electricity and heat. A solid oxide fuel cell operates at a very high temperature, which allows the solid oxide to conduct the oxide ions and to lower the kinetics of the reaction to proceed effectively. However, the high operating temperatures are problematic for the materials forming the fuel cells, shortening the lifespan.

SUMMARY

An embodiment described in examples herein provides a method for making a solid oxide fuel cell assembly (SOFC). The method includes forming a functionalized zeolite templated carbon (ZTC). The functionalized ZTC is formed by forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites. The functionalized ZTC is incorporated into electrodes by forming a mixture of the functionalized ZTC with a calcined solid oxide electrolyte and calcining the mixture. The method includes forming an electrode assembly, forming the SOFC assembly, and coupling the SOFC assembly to a cooling system.

Another embodiment described in examples herein provides a solid oxide fuel cell (SOFC). The SOFC includes an electrode assembly (EA), including an anode, a solid oxide electrolyte, and a cathode, wherein the anode, the cathode, or both includes functionalized zeolite templated carbon (ZTC). The SOFC includes a housing that includes an inlet for a mixture of hydrogen and carbon monoxide, and an outlet for a mixture of steam and carbon dioxide. The SOFC includes a power line coupled to the cathode to provide current from the SO fuel cell to an external power user, and a return line from external power supply coupled to the anode.

DETAILED DESCRIPTION

Solid oxide fuel cells (SOFC) are generally operated at high temperatures, for example, about 700° C. to about 1100° C. The high temperature $CO_2$ fuel provides a techniques for the storage of $CO_2$. Further, the formation of a syngas stream provides a feed stream for the production of other materials, such as synthetic hydrocarbon fuels. However, the high temperatures are problematic as it may cause degradation of materials and high corrosion rates. Further, as the fuel process is endothermic, higher temperatures require more energy to maintain.

In various embodiments, the techniques described herein provide anode and cathode electrodes formed as graded structured carbone-ceramic composites that include a zeolite-templated carbon (ZTC) as an electrocatalyst. Functionally graded materials (FGMs) may be characterized by the variation in composition and structure gradually over volume, resulting in corresponding changes in the properties of the material. The materials can be designed for specific function and applications. Various approaches based on the bulk (particulate processing), preform processing, layer processing and melt processing are used to fabricate the functionally graded materials. There are many areas of application for FGM. The concept is to make a composite material by varying the microstructure from one material to another material with a specific gradient. The electrocatalyst reduces a species on the cathode side and oxidizes species at the cathode. In SO electrolytic cells, an oxygen ion O2− is diffused from to the anode side of this process by a solid electrolyte, as described herein. the use of alternative cathode materials such as composites made of a zeolite-templated carbon (ZTCs) with a solid electrolyte, e.g. which behave effectively as mixed conductors on macroscopic scale and the use of metal and metal oxide-containing ZTCs. These materials exhibit high ion conductivity and electrical, which increases the available area for CO2 reduction and in high oxygen surface exchange coefficients.

A reduction of the operating temperature of solid oxide fuel cells to about 600° C., or less, is desirable for material stability and long term operational stability. It requires the development of new generation of cathode electrodes with high electrocatalytic activity for $CO_2$ reduction.

An electrocatalyst is able to participate in the electron transfer reaction and increase the reaction rate and hence the current at a potential as close as possible to the equilibrium potential. The ZTC electrocatalyst described herein may facilitate the electron transfer and increase the efficiency of the kinetics which may lower the operational temperature. SOFCs can be used with water gas fuel, for example, to oxidize hydrogen and carbon monoxide to form steam and carbon dioxide. The reactions are described with respect to FIG. 1.

Figure 1:
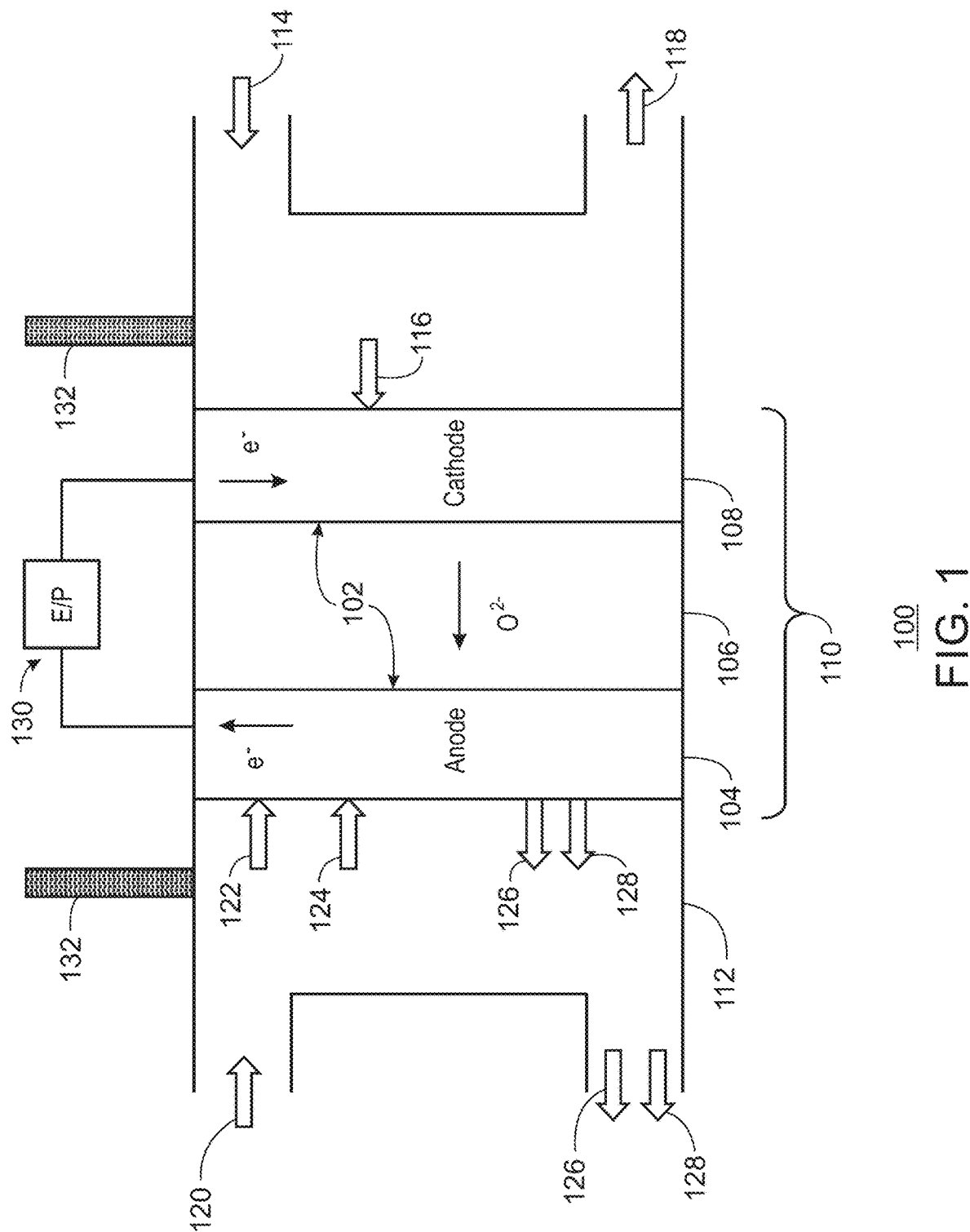
FIG. 1 is a schematic drawing of a solid oxide fuel cell (SOFC) using ZTC supported catalyst at the interfaces between the anode and the solid oxide (SO) and between the SO and the cathode.

FIG. 1 is a schematic drawing of a solid oxide fuel cell (SOFC) 100 using ZTC supported catalyst at the interfaces 102 between the anode 104 and the SO electrolyte 106 and between the SO electrolyte 106 and the cathode 108. In various embodiments, the SO electrolyte is yttria-stabilized zirconia (YSZ), $CeO_2$, or other types of oxygen ion conductors. In contrast to proton exchange membrane fuel cells which conduct positive hydrogen ions (protons) through a polymer electrolyte from the anode to the cathode, the SOFC uses a solid oxide (SO) electrolyte to conduct negative oxygen ions from the cathode to the anode. As used herein, the anode 104, SO electrolyte 106, and cathode 108, with the ZTC supported catalyst layers, forms an electrode assembly (EA) 110, which is supported in a housing 112.

An inlet in the housing 112 is used to introduce air 114, or other oxidizing gas, to the cathode 108. Oxygen 116 reacts at the cathode 108 with electrons to form oxide ions, which are conducted through the SO electrolyte 106 to the anode 104. The half reaction at the cathode 108 is shown below.

$$O_2 + 4e^- \rightarrow 2O^{2-}$$

Excess air 114, including inert gases such as nitrogen, exits the housing 112 through an outlet as a waste oxidizer stream 118.

Another inlet in the housing 112 is used to provide fuel 120, such as hydrogen, light hydrocarbons, or syngas, among others, to the anode 104. Depending on the fuel used, a reforming reaction may take place at the anode 104. As the fuel, or reformed fuel crosses the anode 104, it reacts with the oxygen ions from SO electrolyte 106, releasing electrons. If the fuel is a hydrocarbon, it is reformed to a syngas, including carbon monoxide 122 and hydrogen 124. In this example, the half-reactions at the anode 104 are shown below:

$$H_2 + O^{2-} \rightarrow H_2O + 2e^-$$

$$CO + O^{2-} \rightarrow CO_2 + 2e^-$$

The steam 126 and carbon dioxide 128 formed at the cathode 108 exit the housing 112 through an outlet. The electrons are provided to power an external device 130. If the fuel only fuel 120 only includes the hydrogen 124, only the first half-reaction is relevant.

While the steam 126 and waste oxidizer stream 118 may be used to remove heat from the SOFC 100, in some embodiments, the housing includes a cooling system 132 for removing heat, such as steam generating coils, oil coolant coils, and the like. Although not shown, in some embodiments, the cooling system 132 includes lines or coils in contact with the EA 110 to remove heat. If the SOFC 100 is used in reversible operation as an SO electrolytic cell (SOEC), heat generated during operation as an SOFC may be stored for use during electrolysis. For example, in an embodiment, the heat removed by the cooling system 132 during operation as the SOFC 100 is stored in a reservoir as a molten salt, which is returned to provide heat during the endothermic electrolysis process.

The catalyst, supported on the functionalized ZTC located at the interfaces 102, lowers the activation energy of the half-cell reactions. As the functionalized ZTC has a very high surface area, the catalyst may increase the efficiency, lowering the operation temperature to about 600° C.

Figure 2:
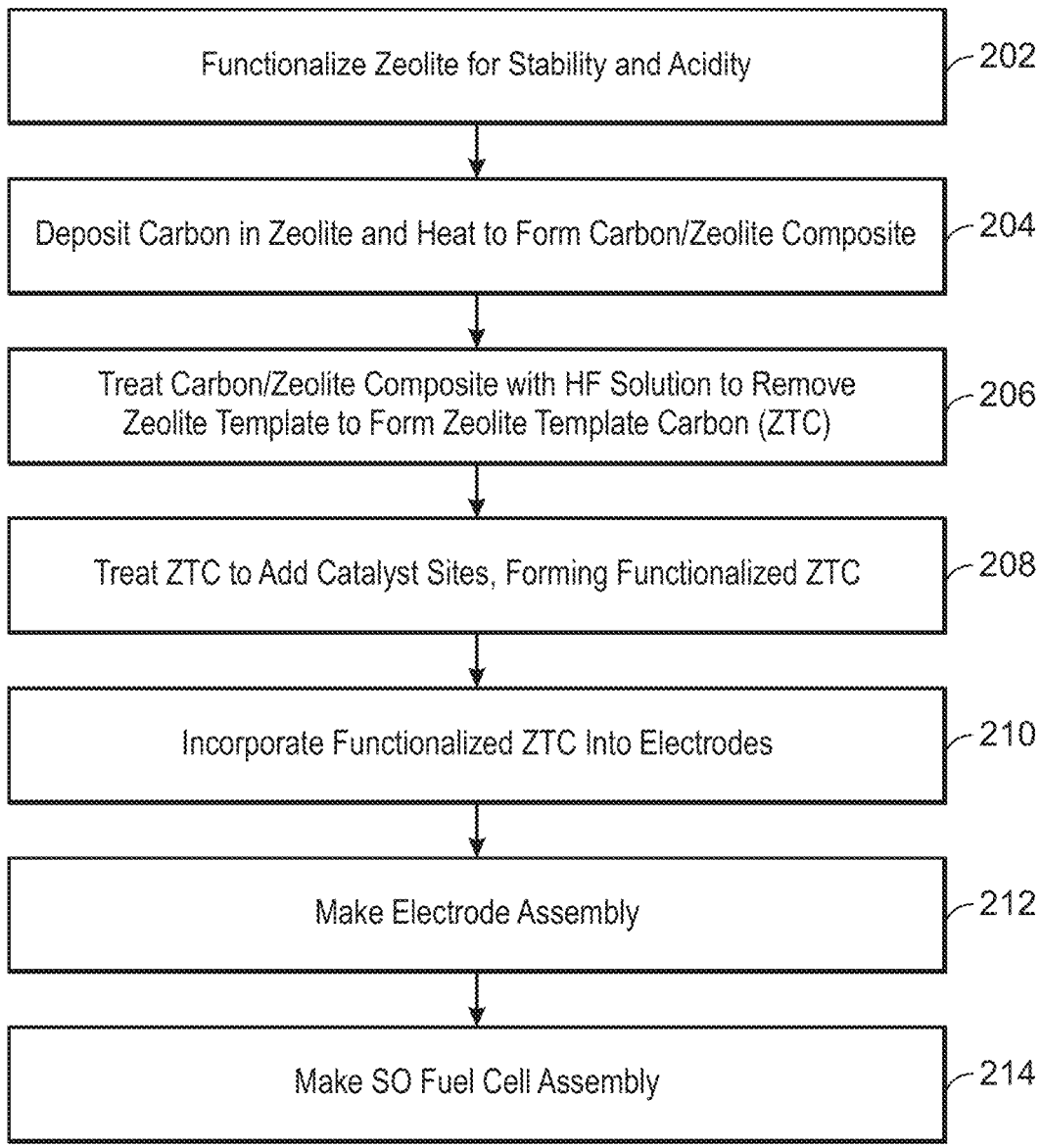
FIG. 2 is a process flow diagram of a method for making an SOFC assembly.

FIG. 2 is a process flow diagram of a method 200 for making a polymer electrode membrane fuel cell. The method 200 begins at block 202 with the ion-exchanging of an NaX zeolite with $Ca^{2+}$ ions to form a CaX zeolite. Although zeolite X is described in detail herein, other zeolites may be used in embodiments, including, for example, zeolite Y, or zeolite BAU, among others. The selection of the zeolite, and any treatments used, such as ion exchange, may be based on the temperature stability and pore size of the zeolite.

At block 204, carbon is deposited in the zeolite to form a carbon/zeolite composite. In various embodiments, a chemical vapor deposition (CVD) process to deposit carbon in the zeolite by exposing the zeolite to an organic precursor gas at an elevated temperature, which deposits carbon in the pores of the zeolite. After deposition, the zeolite containing the deposited carbon is heated to carbonize the deposited carbon, forming a carbon/zeolite composite. In embodiments described herein, carbon is deposited in CaX zeolite by exposing the CaX zeolite to propylene, ethanol, or acetylene in mixtures with helium. In various embodiments, temperatures for the deposition and heat treatment range are between about 820 K and 1125 K. In some embodiments, deposition temperatures are between about 820 K and about 975 K. In one embodiment, the deposition temperature is about 823 K. In another embodiment, the deposition temperature is about 873 K.

At block 206 the carbon/zeolite composite is treated with an aqueous acid solution that includes HF to remove the CaX template forming zeolite template carbon (ZTC). In various embodiments, the aqueous acid solution includes HF and HCl, in approximately equal amounts. In various embodiments, the aqueous acid solution includes about 2 wt. % of each of HF and HCl, about 3 wt. % of each of HF and HCl, or about 4 wt. % of each of HF and HCl.

At block 208, the ZTC is treated to add catalyst sites, forming functionalized ZTC. To serve as electrode or electro catalyst, an oxide, a metal or a metal oxide is added to the ZTC. This can be performed by a number of techniques known in the art, including wet impregnation, sputtering, sputter-deposition, doping, chemical functionalization, thermal coating or electrochemical coating, among others. In some embodiments, this is performed by an incipient wetness technique.

Incipient wetness impregnation (IW or IWI), also called capillary impregnation or dry impregnation, is a commonly used technique for the synthesis of heterogeneous catalysts. Typically, the active metal precursor is dissolved in an aqueous or organic solution. Then the metal-containing solution is added to a catalyst support containing the same pore volume as the volume of the solution that was added. Capillary action draws the solution into the pores. Solution added in excess of the support pore volume causes the solution transport to change from a capillary action process to a diffusion process, which is much slower. The catalyst can then be dried and calcined to drive off the volatile components within the solution, depositing the metal on the catalyst surface. The maximum loading is limited by the solubility of the precursor in the solution. The concentration profile of the impregnated compound depends on the mass transfer conditions within the pores during impregnation and drying.

At block 210, the functionalized ZTC is incorporated into electrodes. This may be performed by impregnation, suction impregnation, chemical crosslinking, or mixing followed by calcination. For example, in an embodiment, the functionalized ZTC is mixed with a calcined solid electrolyte, then the two are calcined together.

In other embodiments, an electrode can be prepared including a metal and metal oxide anode by metal sputtering. The functionalized ZTC can be introduced into the sputtering chamber. A thin metal film can be sputter-deposited first, and a second layer of metal oxide including the functionalized ZTC can be deposited over the metal film. In various embodiments, a magnetron sputtering system is used for the depositions. High purity argon and oxygen can be used as sputtering and reactive gas, respectively.

At block 212, an electrode assembly (EA) is formed. This may be performed by firing a multilayer structure comprising the anode, the solid oxide, and the cathode forming a single ceramic block. The functionalized ZTC may be incorporated into ceramic layers between the anode and the solid oxide, between the solid oxide and the cathode, or in the electrodes themselves. In some embodiments, current collectors are formed into the block with the electrodes and SO.

At block 214, an SOFC assembly is formed. In various embodiments, this is performed by mounting the electrode assembly (EA) in a housing, which has inlets for fuel and oxidizer and outlets for excess oxidizer and for a mixture of $CO_2$ and $H_2O$. In some embodiments, the housing has coils for cooling, for example, by steam generation, cooling oil, and the like. The EA is sealed to the housing, for example, using a ceramic adhesive, followed by firing the part. This prevents gases from the hydrogen side from contacting the oxygen side. In some embodiments, a number of housing units are stacked to increase electric current and voltage. In various embodiments, a cooling system is coupled to the SOFC to keep the temperature of the fuel cell at a target value, such as about 600° C.

Examples

Electrode Preparation Steps:
Synthesis of Zeolite-Templated Carbon (ZTC) on the Electrolyte (Ionic Conductors).
Carbon Replication of CaX Zeolite
CaX zeolite was prepared by ion-exchanging NaX (commercial zeolite, not ultra-large crystal) with $Ca^{2+}$ by stirring 10 g sample in 200 mL of 0.32 M $Ca(NO_3)_2$ solution for 4 h. $Ca^{2+}$ exchange can generate acid sites in zeolite which catalyze the carbon deposition inside zeolite micropores and also increases the thermal stability of zeolite template during the conditions used for the CVD.

Figure 3:
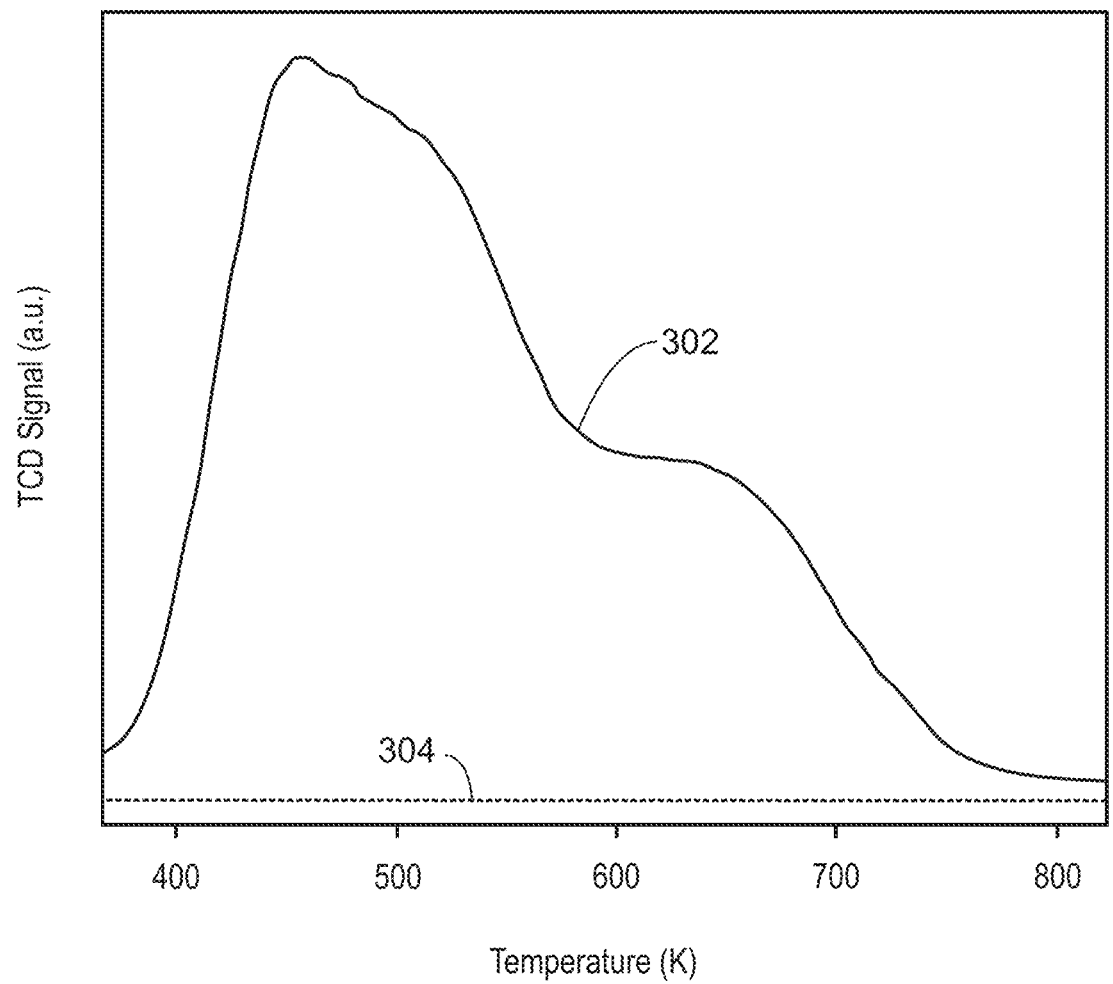
FIG. 3 is a plot comparing $NH_3$ TPD (temperature programmed desorption) profiles of CaX and commercial NaX.

FIG. 3 is a plot 300 comparing $NH_3$ TPD (Temperature Programmed Desorption) profiles of CaX 302 and commercial NaX 304. The plot 300 shows that the ion-exchange of an NaX zeolite with Ca' can generate acidity. This helps with the selective carbon deposition in micropores and enhances the thermal stability of zeolite template.

In the plot 300, the CaX 302 shows two desorption peaks, at 473 and 653 K, indicating the presence of two types of acid sites. In contrast, the NaX tool for does not show any desorption profile, indicating no acidity.

As shown in Table 1, the CaX zeolite also has a higher thermal stability than NaX, wherein the crystallinity does not change at temperatures up to 973 K. The thermal stability is useful, as the carbon deposition condition uses a chemical vapor deposition (CVD) at temperatures of 873~973 K.

TABLE 1

Thermo stability of NaX, CaX zeolites

| Sample | $A_z$[1] | $T_{init}$[2] (K) | $T_{0.5}$[3] (K) |
|---|---|---|---|
| NaX | 1 | 933 | 1043 |
| CaX | 0.93 | 983 | 1153 |

[1]Equivalent fraction of exchange cation in zeolite.
[2]Temperature at which structural degradation is first observed from the X-ray powder pattern, in K.
[3]Temperature at which the structure is 50% decomposed, in K.

Carbon Deposition in Zeolites
The carbon deposition in the X zeolites was carried out in a conventional plug-flow reactor. Typically, 1 g NaX or CaX sample was placed in plug flow reactor and the temperature was increased to a specified temperature under He flow. For example, a temperature range of about 823 K to about 973 K is suitable to selectively deposit carbon in zeolite micropores. In some embodiments using NaX and propylene the temperature is 973 K. After the temperature was allowed to stabilize for 30 min, the gas was switched to an organic precursor gas. Three different organic precursor gases were used for the carbon deposition. The organic precursor gases were propylene, ethanol, and acetylene with respective kinetic diameters of 0.45, 0.45 and 0.33 nm. These were used in mixtures, with the propylene added as a 2% propylene/He (200 mL/min·g) mixture. The ethanol was added as a helium gas flow (200 mL/min·g) that was saturated with ethanol at room temperature, using bubbler, 6 kPa. The acetylene was added as a 2 vol. % acetylene/He gas (200 mL/min·g) mixture. After flowing the organic precursor gas for the specified time, the gas was switched to He and the reactor was cooled to room temperature. The incorporation of the organic precursor gas into the zeolite resulted in a zeolite/carbon composite.

Removing the Zeolite Template
To remove the zeolite template and format the microporous carbon, the zeolite/carbon composite was treated with a water solution of HCl and HF (3.4 wt. % HCl/3.3 wt. % HF) at room temperature two times for 1 hour each time. This formed the microporous carbon. The resultant template-free carbon materials were filtered from the solution, washed thoroughly with deionized water and dried at 373 K overnight.

Figure 4:
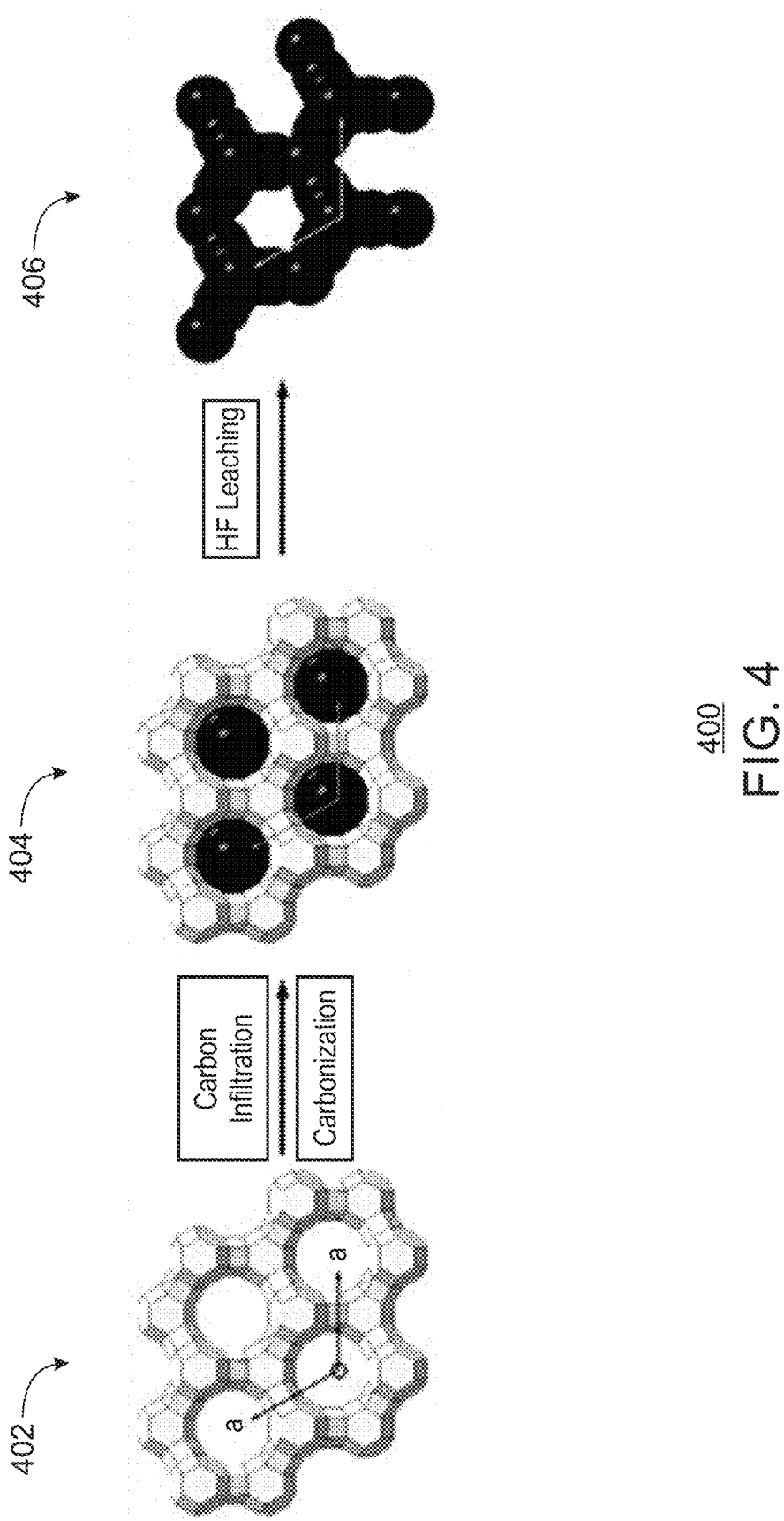
FIG. 4 is a schematic diagram of the synthesis of the zeolite templated carbon (ZTC)

FIG. 4 is a schematic diagram of the synthesis of the zeolite templated carbon (ZTC). As used herein, the ZTC may also be termed microporous carbon. The zeolite 402 may be treated, for example, with ion exchange, to form CaX. As shown in FIG. 4, the zeolite 402 has carbon deposited in the pores of the zeolite through carbon infiltration and carbonization. This forms a carbon/zeolite nano composite 404. The carbon/zeolite nano composite 404 is exposed to an acidic leaching using HCl/HF to form the ZTC 406.

Optimization of Organic Precursor for Carbon Replication of CaX

Figure 5:
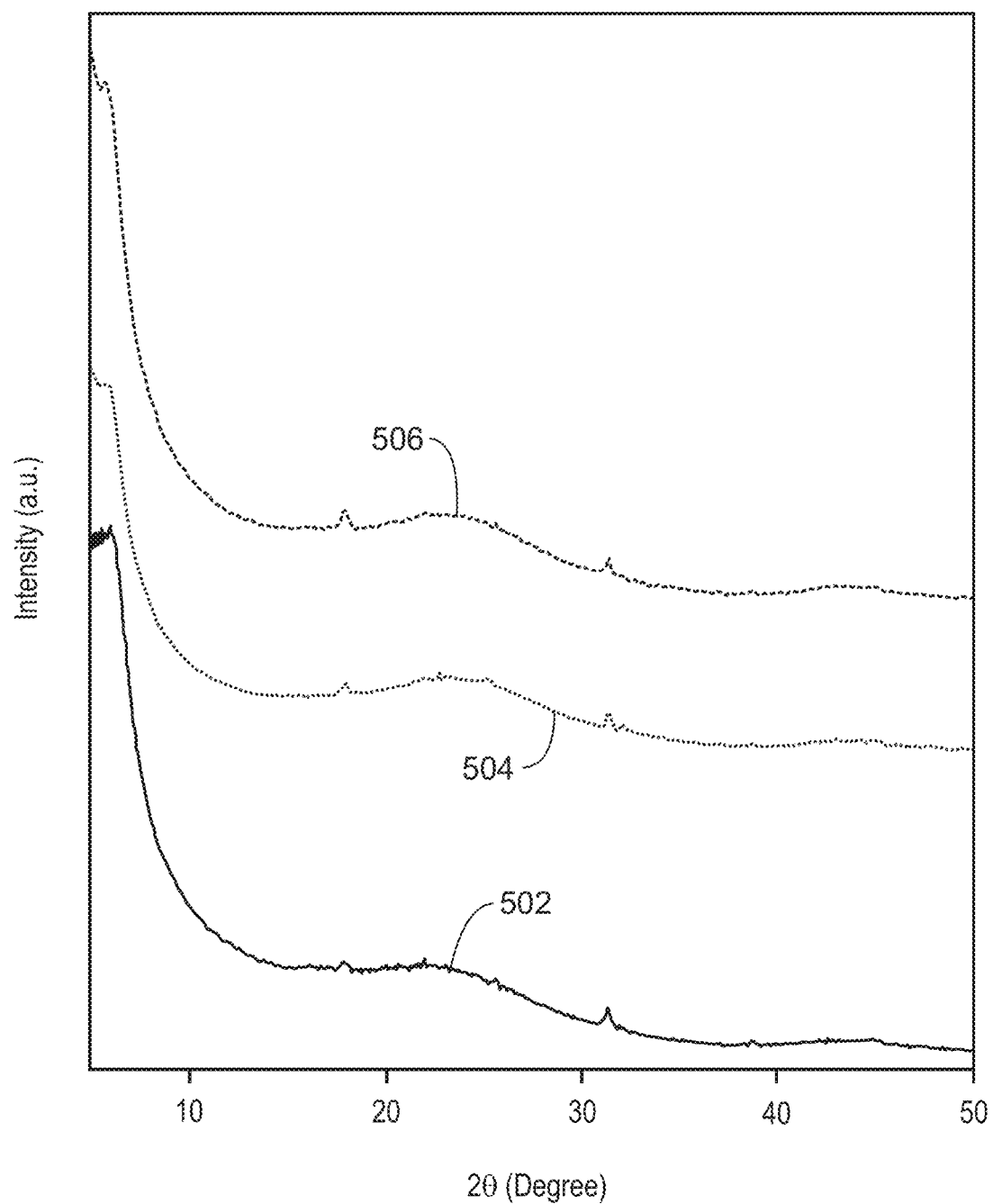
FIG. 5 is an XRD plot of the results for the different ZTCs formed.

FIG. 5 is an X-ray powder diffraction (XRD) plot 500 of the results for different ZTCs formed. As used herein, XRD is used for phase identification of a crystalline material and can provide information on unit cell dimensions. The material to be analyzed is finely ground, homogenized, and an average bulk composition is determined. XRD is the used to characterize the structure. To optimize the CVD conditions for carbon deposition in CaX, two different carbon precursors, propylene and ethanol, were deposited at different temperatures. In FIG. 5, and the description herein, the resultant ZTCs will be designated as CaX-tttNx where CaX indicates the zeolite template, ttt indicates temperature of the CVD in kelvin (K), N represents the organic precursor gas, e.g., P for propylene, E for ethanol, or A for acetylene. The term x indicates the CVD reaction time in hours. Accordingly, CaX-973P5-C 502 is a ZTC formed using CaX as the template at a CVD deposition temperature of 973 K, using propylene as the organic precursor gas for a CVD reaction time of 5 hours. Further, if the template has been removed, this is indicated by the addition of -C at the end of the designation. Other ZTCs shown in FIG. 4 include CaX-973E6-C 504 and CaX-1073E6-C 506. As described with respect to the nomenclature above, the latter two were both formed using ethanol as the organic precursor gas at a temperature of 973 K and 1073 K, respectively.

As shown in the XRD plot 500, the ZTCs formed using the CaX as a template have a broad peak around a 2θ of about 5° to about 6° which indicates presence of structural order in the arrangement of the micropores. The CaX-973P5-C 502 showed the most highly resolved peak at a 2θ of about 5° to about 6°, indicating the most faithful replication of the zeolite structure. As used herein, the reference numbers in the XRD plot 500, e.g., 502, 504, and 506, refer to the particular structures, and are used to indicate the same structures in the following plots.

Figure 6B:
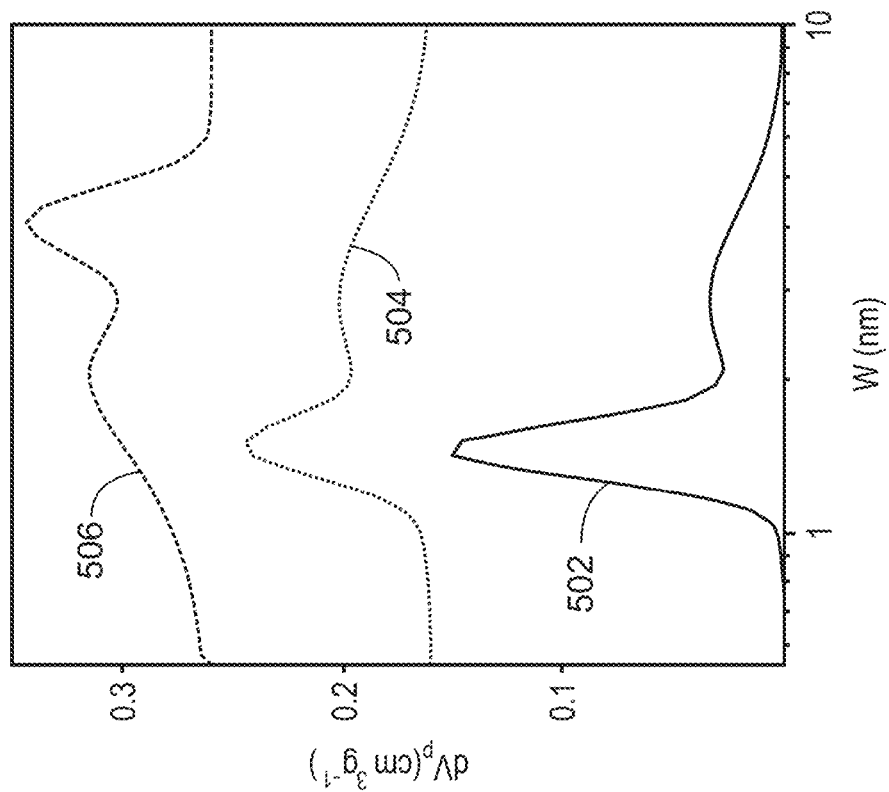
FIG. 6B is a plot of the pore size distribution of the ZTCs using an NLDFT algorithm.
Figure 6A:
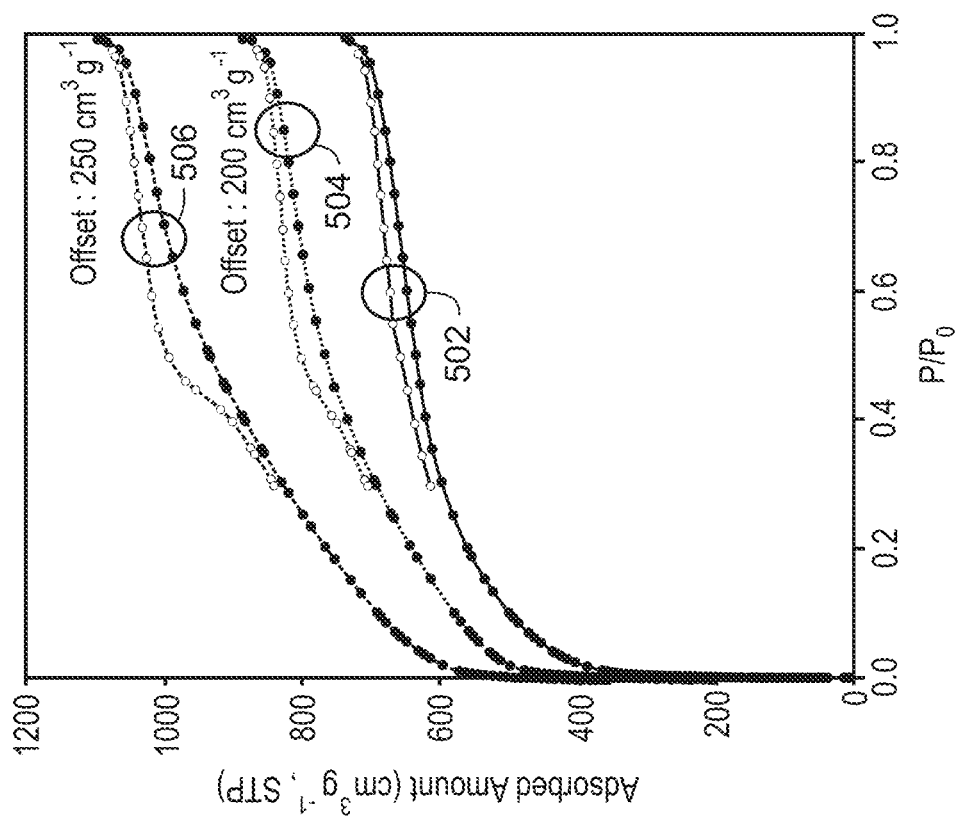
FIG. 6A is a plot of $N_2$ adsorption/desorption isotherms for the three different ZTCs.

FIG. 6A is a plot of $N_2$ adsorption/desorption isotherms for the three different ZTCs. In each of these plots, and the following plots, filled circles represent values collected during the pressure increase process, and open circles represent values during the pressure decrease process. Each group of one filled circle and one open circle represents one cycle of adsorption and desorption. FIG. 6B is a plot of the pore size distribution of the ZTCs using a non-local density functional theory (NLDFT) algorithm. As known in the art, density functional theory (DFT) is a quantum mechanical modeling process used to determine structural features from quantum mechanical calculations. Like numbered plots use the same reference numbers for referring to materials as in FIG. 5.

As shown in the $N_2$ adsorption/desorption isotherms of FIG. 6A (Table 2), the carbon materials showed dual porosity, with micropores of about 1.5 nm to about 2 nm in diameter, and mesoporosity, with pores of about 2 nm to about 5 nm. Since the initial CaX contained only microporous structure, the presence of mesopores, e.g., less than about 0.40 $cm^3g^{-1}$, indicates a poor replication of the microporous structure of the zeolite. The presence of the mesopores in the carbon replicas can be attributed to incomplete filling of the zeolite micropores with carbon.

The organic precursor may not diffuse into the zeolite micropores above a certain level of carbon filling, due to steric effects. Thus, better carbon filling, leading to higher surface area and micropore volume, may be achieved using a smaller carbon precursor such as acetylene. In Table 2, it can be noted that sample CaX-1023A2-C exhibited much higher surface area (2567 $m^2g^{-1}$) than the samples prepared with propylene (1900 $m^2g^{-1}$) and ethanol (1792 $m^2g^{-1}$). Furthermore, CaX-1023A2-C showed the highest micropore volume (1.09 $cm^3g^{-1}$).

TABLE 2

BET surface area and pore volumes of carbon replicas.

| Sample | $S_{BET}$[1] ($m^2g^{-1}$) | $V_{micro}$[2] ($cm^3g^{-1}$) | $V_{meso}$[2] ($cm^3g^{-1}$) | $V_{total}$[2] ($cm^3g^{-1}$) |
|---|---|---|---|---|
| CaX-973P5-C | 1915 | 0.75 | 0.34 | 1.09 |
| CaX-973E6-C | 1596 | 0.58 | 0.48 | 1.06 |
| CaX-1073E6-C | 1826 | 0.65 | 0.66 | 1.31 |
| CaX-1023A2-C | 2567 | 0.95 | 0.42 | 1.37 |

[1]Brunauer-Emmett-Teller (BET) surface area.
[2]Micropore volume ($V_{micro}$) calculated using DR equation.

Optimization of CVD Conditions for Acetylene Incorporation into CaX Zeolites

The results in Table 2 indicate that acetylene is most suitable for the faithful carbon replication of zeolite. This is likely due to acetylene having the smallest kinetic diameter (0.33 nm) and the highest C/H ratio. The carbon replica synthesized by CVD using acetylene at 1023 K for 2 h showed relatively high BET surface area (2567 $m^2g^{-1}$) and large micropore volume (>1.00 $cm^3g^{-1}$). Such synthesis results, however, were difficult to reproduce especially when a larger amount of zeolite template (>1 g) is used for carbon CVD. The limitations in reproducibility and scale-ups have been the main obstacles for the practical application of the zeolite-templated carbon materials.

Properties of ZTC Replicated from Large Crystallite CaX (LCaX)

The techniques described above were used to synthesize ZTC from CaX having a large crystallite size, for example, between about 10 μm to about 20 μm. The zeolite itself is designated as LCaX 702 in data and plots herein. The resulting structural properties are shown in Table 3. Hereinafter, the samples synthesized using the larger-crystal CaX will be denoted with a prefix of LCaX to differentiate from samples synthesized using CaX having small crystallites (about 2 μm or less). Thus, the samples will be denoted with the nomenclature of "zeolite template-CVD temperature-CVD time-heat treatment-template". For example, LCaX-873-4H-C indicates a microporous carbon sample synthesized by CVD with acetylene at 873 K for 4 h and heat treated, followed by removal of the zeolite template. LCaX-873-4H4H-C sample is similarly synthesized by repeating the cycle of 4 h acetylene CVD/heat treatment twice.

TABLE 3

Pore structural properties of the carbons replicated from of larger-crystal CaX

| Entry | Sample | $S_{BET}$[1] ($m^2 g^{-1}$) | $V_{micro}$[2] ($cm^3 g^{-1}$) | $V_{meso}$ ($cm^3 g^{-1}$) | $V_{total}$ ($cm^3 g^{-1}$) | Ref. Nos. in plots |
|---|---|---|---|---|---|---|
| 1 | LCaX-1023-2-C [3] | 2567 | 0.95 | 0.42 | 1.37 | 802[5] |
| 2 | LCaX-1023-2-C [4] | 2156 | 0.83 | 0.43 | 1.26 | |
| 3 | LCaX-973-3-C [3] | 2381 | 0.93 | 0.31 | 1.24 | |
| 4 | LCaX-873-4-C [3] | 841 | 0.33 | 0.12 | 0.45 | 704[5] |
| 5 | LCaX-873-4H-C [3] | 3049 | 1.12 | 0.45 | 1.57 | 706[5] |
| 6 | LCaX-873-4H4H-C [3] | 2830 | 1.10 | 0.23 | 1.33 | 708[5] |
| 7 | LCaX-873-4H4H-C [4] | 2840 | 1.12 | 0.21 | 1.33 | |
| 9 | LCaX-823-9H4H-C [4] | 2950 | 1.17 | 0.18 | 1.35 | |

Figure 7:
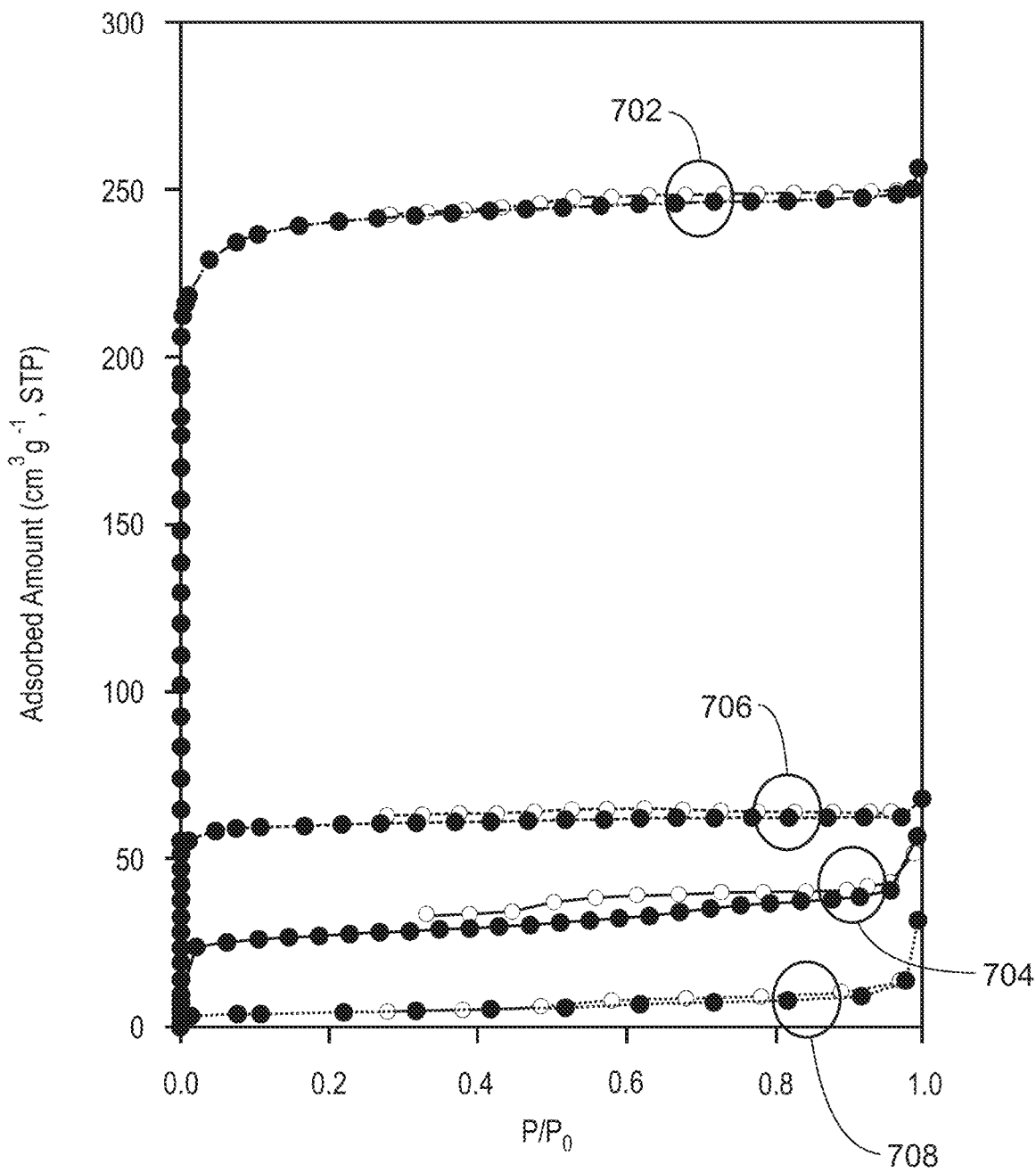
FIG. 7 is a plot of the $N_2$ adsorption-desorption isotherms of zeolite-carbon composite (without zeolite template removal) collected at the different steps of the synthesis process.

[1]Brunauer-Emmett-Teller (BET) surface area.
[2]Micropore volume ($V_{micro}$) calculated using DR equation.
[3] 1 g zeolite is used for acetylene CVD.
[4] 5 g zeolite is used for acetylene CVD.
[5]Plots in FIGS. 7 are without zeolite template removal, plots in FIG. 8 are after zeolite template removal.

The results in entries 1, 3 and 4 showed that higher CVD temperature is useful for obtaining higher surface area and micropore volume. The carbon synthesized at relatively low temperature (873 K, entry 4) showed significantly lower surface area than other samples, which indicates that carbon structure is not sufficiently graphitized (or rigid) at 873 K and thus collapsed after removal of zeolite template. The result also shows that only highly graphitized carbon structure can retain highly microporous structure. Unfortunately, such high-temperature acetylene CVD is very sensitive to the starting amount of zeolite template, e.g., the bed thickness in the fixed-bed reactor. If the amount of zeolite is increased from 1 to 5 g, as shown by the comparison of entries 1 and 2, for CVD using acetylene, the BET surface area and porosity of the resultant carbon decreased significantly.

To overcome this problem, a sequential carbon synthesis procedure is described herein, which is composed of low-temperature acetylene CVD (<873 K) and high-temperature heat treatment (1123 K) under noble gas (He). At low CVD temperature (<873 K), carbon deposition occurs very uniformly over the zeolite bed. After the micropore of the zeolite is fully filled with non-graphitized carbon, the gas stream is switched to He and the temperature is increased to 1123 K for the graphitization (densification) of the carbon structure. Such consecutive steps allow uniform and selective deposition of high graphitized carbons inside the zeolite micropores. In result, LCaX-873-4H-C (entry 5) shows very high surface area of 3049 $m^2 g^{-1}$ and micropore volume of 1.12 $cm^2 g^{-1}$, even surpass those of sample LCaX-1023-2-C 802 (entry 1, FIGS. 8A-8C).

FIG. 7 is a plot 700 of the $N_2$ adsorption-desorption isotherms of zeolite-carbon composite (without zeolite template removal) collected at the different steps of the synthesis process. All measurements are in comparison to the microporosity of the LCaX 702. After the acetylene CVD at 873 K for 4 h (LCaX-873-4 704), negligible microporosity remains inside the zeolite template. This indicates that the zeolite micropore is fully filled with the non-graphitized carbon framework. After thermal treatment at 1123 K for 4 h under He (LCaX-873-4H 706), c.a. 25% of the zeolite micropore volume is regenerated. The result reveals that the thermal treatment led to the densification and hence the volume shrinkage of carbon framework inside the zeolite micropores. Because the considerable fraction of zeolite micropores are regenerated after the thermal treatment, a secondary CVD/thermal treatment cycle using acetylene can be carried out to fill the remaining micropores. After repeating the CVD-thermal treatment cycle twice (LCaX-873-4H4H 708), the micropore of zeolite template are nearly fully filled with the graphitized carbon framework. After the removal of zeolite template, the repeated CVD/thermal treatment cycles significantly reduce the carbon mesopore volume while retaining the BET surface area: LCaX-873-4H4H-C 708 (0.23 $cm^3 g^{-1}$) showed significantly reduced mesopore volume than LCaX-873-4H 706 (0.45 $cm^3 g^{-1}$), as seen by comparing entries 5 and 6 in Table 3.

The result indicates that incomplete filling of zeolite micropores leads to the formation of mesopores in the replicated carbon structure. It can be noted that the sequential carbon synthesis procedure allows high reproducibility of the carbon structure regardless of the zeolite amount (bed thickness) used for the carbon synthesis (compare entries 6 and 7).

Decreasing the initial acetylene CVD temperature from about 873 K to about 823 K, the carbon can be synthesized (entry 9) with slightly enhanced BET surface area and micropore volume. Based on these results, an optimum temperature range for initial acetylene CVD is between about 823 K to about 873 K. At CVD temperatures lower than 773 K, the carbon deposition was too slow for practical application.

Figure 8A:
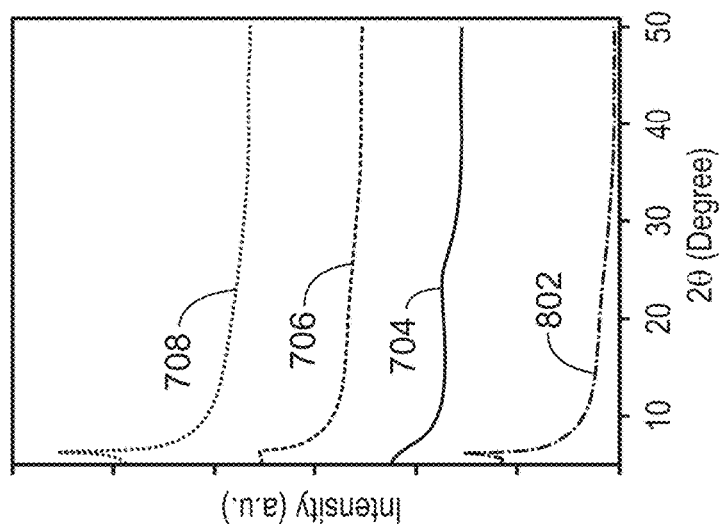
FIGS. 8A to 8C show the $N_2$ adsorption isotherms and XRD patterns for the representative samples in Table 3.
Figure 8B:
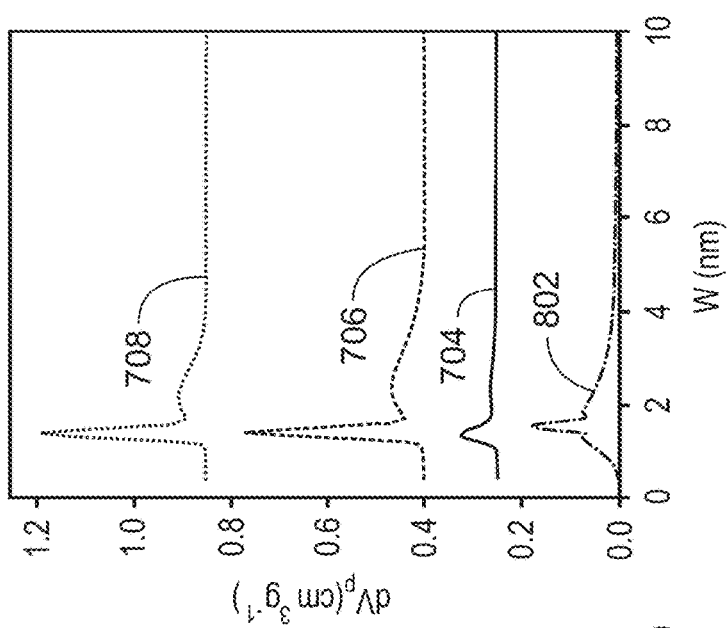
Figure 8C:
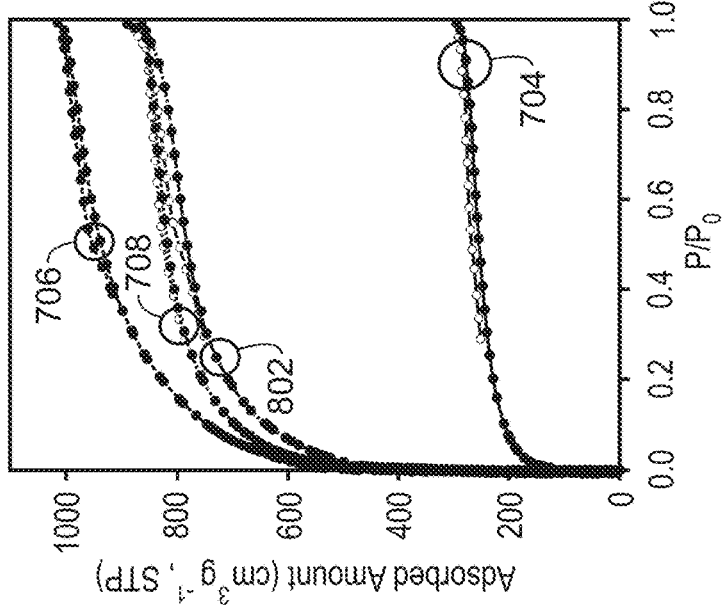

FIGS. 8A to 8C show the $N_2$ adsorption isotherms and XRD patterns for the representative samples in Table 3. It is noteworthy that the most faithfully replicated carbon structure (LCaX-873-4H4H-C 708) shows a Type I isotherm with small amount of $N_2$ adsorption at high pressure regime (P/P$_0$>0.1). LCaX-873-4H-C 706 sample synthesized by single cycle of acetylene CVD/thermal treatment showed even higher total pore volume than the sample of LCaX-873-4H4H-C 708, but the enhancement is only due to the presence of secondary mesoporosity, as indicated by the more pronounced adsorption at P/P$_0$>0.1. The samples synthesized by subsequent acetylene CVD-heat treatment cycle, LCaX-873-4H-C 706 and LCaX-873-4H4H-C 708, showed much narrower and more intense pore size distribution in the micropore regime (W<2 nm). It can be noted that the replicated carbon (LCaX-873-4H4H-C 708) showed a very sharp peak at 2θ=6.3° in XRD. This indicates that the replicated carbon has ordered microporous structure like zeolite. Therefore, the presence of the sharp XRD peak at 2θ=6.3° can be used as an indicator for evaluating the replication of zeolite structure, e.g., the efficiency of the carbon deposition.

ZTC Functionalization.

Figure 9:
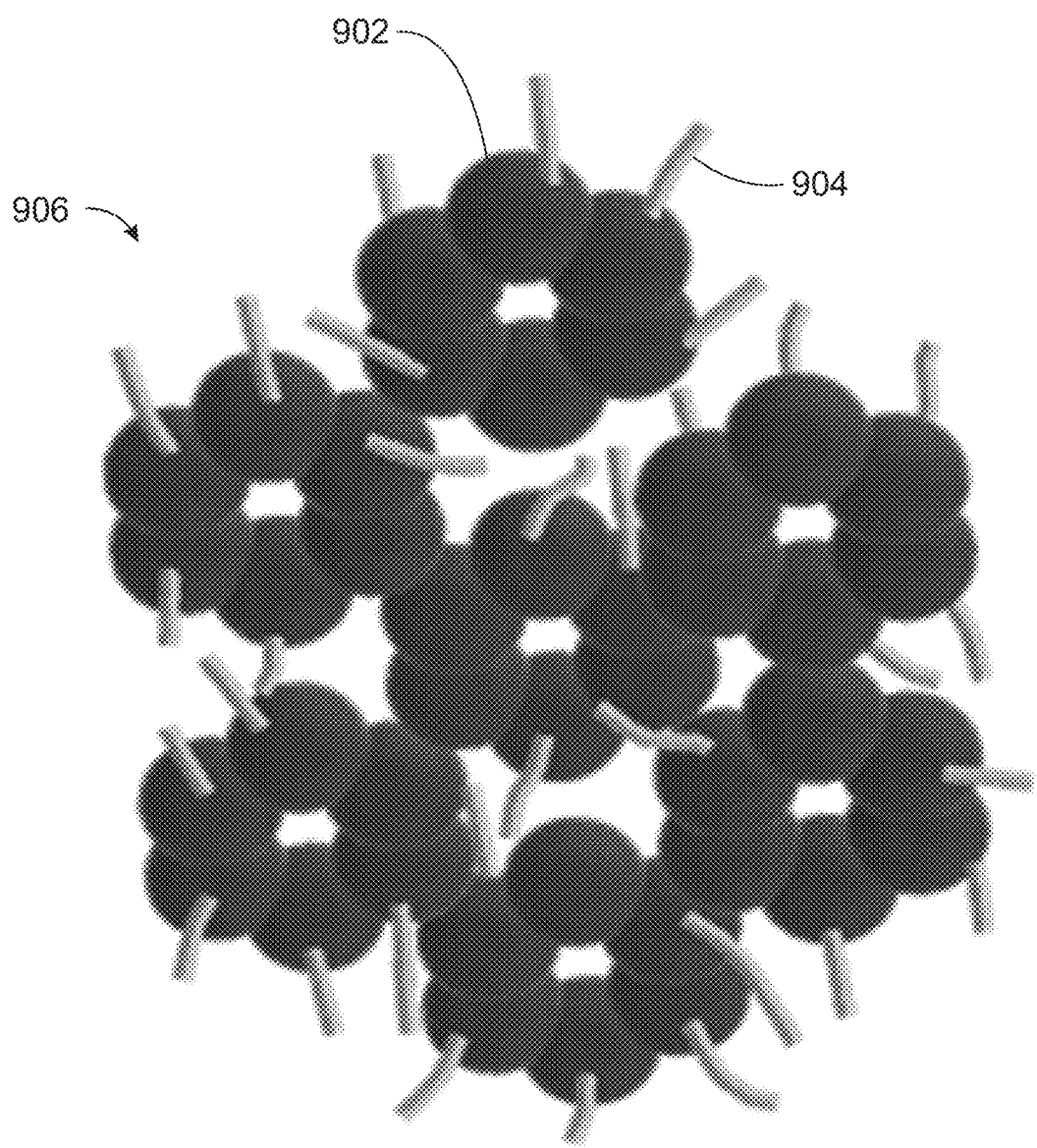
FIG. 9 is a drawing of a ZTC impregnated with catalyst particles forming a functionalized ZTC.

FIG. 9 is a drawing of a ZTC 902 impregnated with catalyst particles 904 forming a functionalized ZTC 906. In the example described herein, wet impregnation can be used to load a noble metal, such as platinum, onto a ZTC 902 support to function as a catalyst. For example, to impregnate Pt, a solution of $Pt(NH_3)(NO_3)_2$ can be prepared using the desired amount. In various embodiments, the amount can range from 0.1 wt % to 5 wt %. In some embodiments, 3 wt % is used, a solution volume equivalent to the pore volume of the ZTC 902 used is added to wet the ZTC 902. The impregnated ZTC is dried in oven at 80° C. overnight. The dried Pt/ZTC is then calcined under a $N_2$ flow at a flow rate of 50 ml/min. This can be performed at 500° C. for 12 hours to decompose the metal nitrates. After decomposition of the metal nitrates, the Pt/ZTC can be reduced in flowing hydrogen, for example, at a flow rate of 50 ml/min for 2 hours at 500° C., to produce dispersed Pt or catalyst particles 904 on the ZTC 902, herein termed functionalized ZTC 906.

In some embodiments, a strong electrostatic adsorption (SEA) method is used. In this method, impregnation is controlled by adjusting the pH of the carbon/water/precursor slurry to the adequate value to increase the electrostatic interactions between the metal precursor and the support are maximized.

Incorporating Functionalized ZTC into Electrode

After impregnation of the catalyst particles, the functionalized ZTC is added to the electrodes. In an embodiment, the functionalized ZTC is added to the surface of the anode or the cathode, or the solid oxide electrolyte before calcination.

In various embodiments, a calcinated YSZ powder, or other solid oxide electrolyte, is wet milled in a suitable solvent, such as propanol, for a period of time, such as 2 to 3 hours. The functionalized ZTC is then mixed with the milled YSZ, and calcined in a two-step process. A first calcination is carried out at about 900° C. to about 1000° C. for about 12 hours, followed by wet milling, and then a second calcination at about 1000° C. to about 1100° C. for about 10 hours.

In some embodiments, the electrode is impregnated with the functionalized ZTC by sputtering. For example, the functionalized ZTC can be introduced into the gas in a sputtering chamber.

Figure 10:
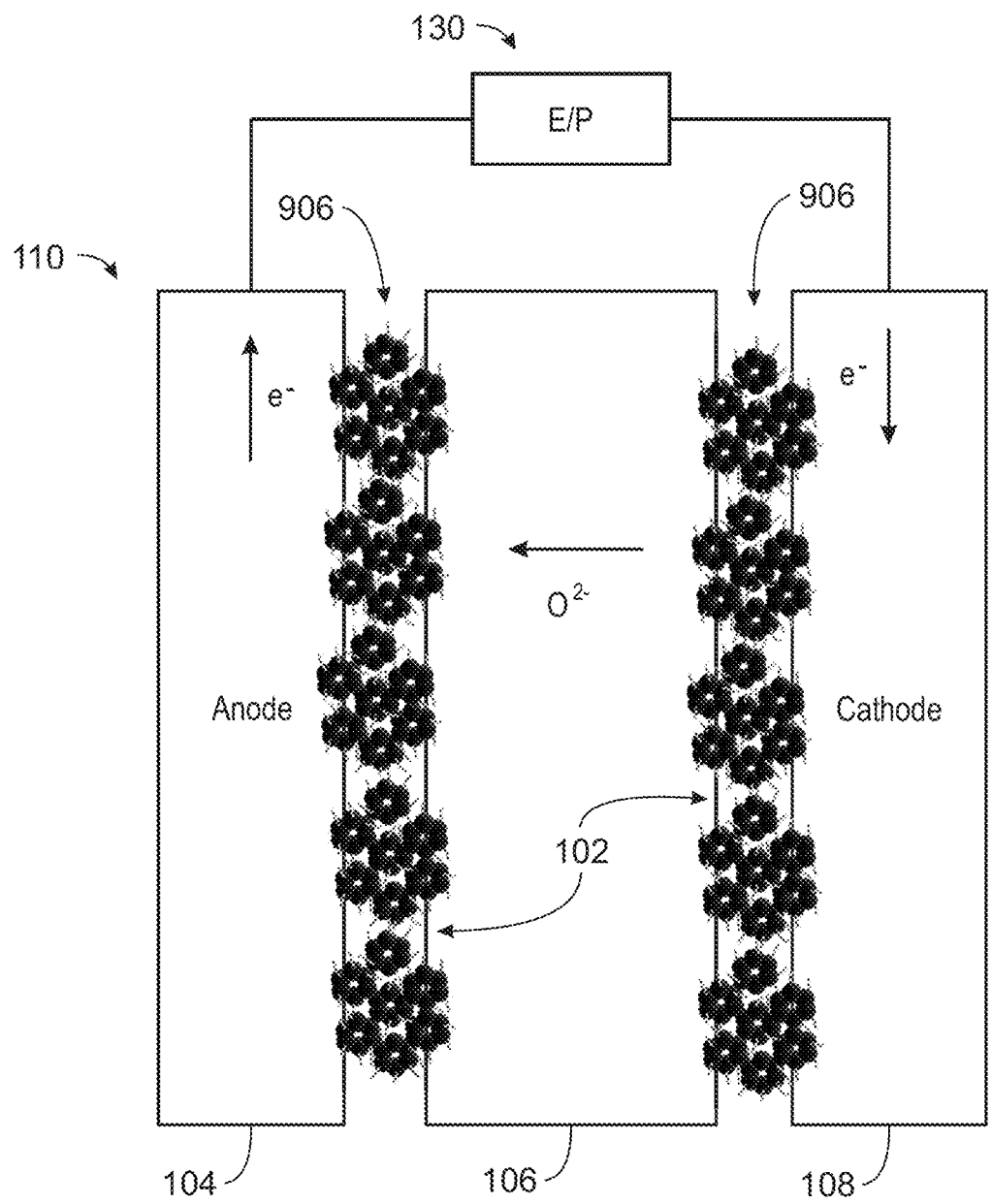
FIG. 10 is a schematic drawing of an electrode assemble with the functionalized ZTC incorporated into the interfaces between the SO and the anode and the cathode

Electrode Assembly (EA) Preparation:

FIG. 10 is a schematic drawing of an EA 110 with the functionalized ZTC incorporated into the interfaces between the SO and the anode and the cathode. Like numbered items are as described with respect to FIG. 1.

SO Fuel Cell Assembly

The final SOFC assembly 100, shown in FIG. 1, is made by mounting the EA 110 (FIGS. 1 and 9) into a housing 112.

As described herein, in various embodiments, cooling systems 132 in the EA 110 are used to removed heat from the SOFC 100. These may also be used to add heat to the EA 110 to bring the temperature into the operating temperature range during startup.

Embodiments

An embodiment described in examples herein provides a method for making a solid oxide fuel cell assembly (SOFC). The method includes forming a functionalized zeolite templated carbon (ZTC). The functionalized ZTC is formed by forming a CaX zeolite, depositing carbon in the CaX zeolite using a chemical vapor deposition (CVD) process to form a carbon/zeolite composite, treating the carbon/zeolite composite with a solution including hydrofluoric acid to form a ZTC, and treating the ZTC to add catalyst sites. The functionalized ZTC is incorporated into electrodes by forming a mixture of the functionalized ZTC with a calcined solid oxide electrolyte and calcining the mixture. The method includes forming an electrode assembly, forming the SOFC assembly, and coupling the SOFC assembly to a cooling system.

In an aspect, the CaX zeolite is formed by ion exchanging a NaX zeolite with calcium ions. In an aspect, the CVD process uses propylene, ethanol, or acetylene, or any combinations thereof, as an organic precursor gas. In an aspect, the CVD process uses acetylene as an organic precursor gas. In an aspect, the acetylene is added as a 2 vol. % solution in helium. In an aspect, the CVD process is performed at a temperature of between 823 K and 1123 K.

In an aspect, the CVD process includes depositing carbon in a matrix of the CaX zeolite at a first temperature using a gas stream including acetylene, switching the gas stream to a helium stream, and increasing the temperature to a second temperature. In an aspect, the first temperature is less than 875 K. In an aspect, the first temperature is about 823 K. In an aspect, the second temperature is greater than 1120 K. In an aspect, the second temperature is about 1123 K.

In an aspect, the method includes repeating the CVD process by cooling back to the first temperature, switching the gas stream back to the gas stream including acetylene, depositing carbon in the matrix of the CaX zeolite at the first temperature, switching the gas stream to the helium stream, and increasing the temperature to the second temperature.

In an aspect, the method includes forming the functionalized ZTC using an incipient wetness technique. In an aspect, the method includes dissolving an active metal precursor to form an aqueous solution, adding an amount of the aqueous solution to the ZTC corresponding to a pore volume of the ZTC forming a metal/ZTC composite, drying the metal/ZTC composite, and sintering the metal/ZTC composite to form the functionalized ZTC. In an aspect, the method includes incorporating the functionalized ZTC onto an anode, a cathode, or both by sputtering.

In an aspect, the method includes forming the electrode assembly by firing the anode with the incorporated functionalized ZTC to form a ceramic anode, firing the solid oxide electrolyte (SOE) to form a ceramic SOE, firing the cathode with the incorporated functionalized ZTC to form a ceramic cathode, assembling the ceramic anode, ceramic SOE, and ceramic cathode into an assembly, and firing the assembly to form the electrode assembly.

Another embodiment described in examples herein provides a solid oxide fuel cell (SOFC). The SOFC includes an electrode assembly (EA), including an anode, a solid oxide electrolyte, and a cathode, wherein the anode, the cathode, or both includes functionalized zeolite templated carbon (ZTC). The SOFC includes a housing that includes an inlet for a mixture of hydrogen and carbon monoxide, and an outlet for a mixture of steam and carbon dioxide. The SOFC includes a power line coupled to the cathode to provide current from the SO fuel cell to an external power user, and a return line from external power supply coupled to the anode.

In an aspect, the SOFC includes a cooling system to remove heat from the SOFC. In an aspect, the SOFC includes a layer of functionalized ZTC disposed at the interface between the anode and the SO, the interface between the cathode and the SO, or both. In an aspect, the solid oxide electrolyte includes yttria-stabilized zirconia (YSZ).

Other implementations are also within the scope of the following claims.

What is claimed is:

1. A method for making a solid oxide fuel cell assembly (SOFC), comprising:
   forming a functionalized zeolite templated carbon (ZTC), comprising:
      forming a CaX zeolite;
      depositing carbon in the CaX zeolite using a chemical vapor deposition (CVD) process to form a carbon/zeolite composite;
      treating the carbon/zeolite composite with a solution comprising hydrofluoric acid to form a ZTC; and
      treating the ZTC to add catalyst sites, forming the functionalized ZTC; and
   incorporating the functionalized ZTC into electrodes, comprising:
      forming a mixture of the functionalized ZTC with a calcined solid oxide electrolyte; and
      calcining the mixture;
   forming an electrode assembly;
   forming the SOFC assembly; and
   coupling the SOFC assembly to a cooling system.

2. The method of claim 1, wherein the CaX zeolite is formed by ion exchanging a NaX zeolite with calcium ions.

3. The method of claim 1, wherein the CVD process uses propylene, ethanol, or acetylene, or any combinations thereof, as an organic precursor gas.

4. The method of claim 1, wherein the CVD process uses acetylene as an organic precursor gas.

5. The method of claim 4, wherein the acetylene is added as a 2 vol. % solution in helium.

6. The method of claim 1, wherein the CVD process is performed at a temperature of between 823 K and 1123 K.

7. The method of claim 1, wherein the CVD process comprises:
   depositing carbon in a matrix of the CaX zeolite at a first temperature using a gas stream comprising acetylene;
   switching the gas stream to a helium stream; and
   increasing the temperature to a second temperature.

8. The method of claim 7, wherein the first temperature is less than 875 K.

9. The method of claim 7, wherein the first temperature is about 823 K.

10. The method of claim 7, wherein the second temperature is greater than 1120 K.

11. The method of claim 7, wherein the second temperature is about 1123 K.

12. The method of claim 7, comprising repeating the CVD process by cooling back to the first temperature;
   switching the gas stream back to the gas stream comprising acetylene;
   depositing carbon in the matrix of the CaX zeolite at the first temperature;
   switching the gas stream to the helium stream; and
   increasing the temperature to the second temperature.

13. The method of claim 1, comprising forming the functionalized ZTC using an incipient wetness technique.

14. The method of claim 1, comprising:
   dissolving an active metal precursor to form an aqueous solution;
   adding an amount of the aqueous solution to the ZTC corresponding to a pore volume of the ZTC forming a metal/ZTC composite;
   drying the metal/ZTC composite; and
   sintering the metal/ZTC composite to form the functionalized ZTC.

15. The method of claim 1, comprising incorporating the functionalized ZTC onto an anode, a cathode, or both by sputtering.

16. The method of claim 1, comprising forming the electrode assembly by:
   firing the anode with the incorporated functionalized ZTC to form a ceramic anode;
   firing the solid oxide electrolyte (SOE) to form a ceramic SOE;
   firing the cathode with the incorporated functionalized ZTC to form a ceramic cathode;
   assembling the ceramic anode, ceramic SOE, and ceramic cathode into an assembly; and
   firing the assembly to form the electrode assembly.

17. A solid oxide fuel cell (SOFC), comprising:
   an electrode assembly (EA), comprising:
      an anode;
      a solid oxide electrolyte; and
      a cathode, wherein the anode, the cathode, or both comprises functionalized zeolite templated carbon (ZTC);
   a housing comprising:
      an inlet for a mixture of hydrogen and carbon monoxide; and
      an outlet for a mixture of steam and carbon dioxide;
   a power line coupled to the cathode to provide current from the SO fuel cell to an external power user; and
   a return line from external power supply coupled to the anode.

18. The SOFC of claim 17, comprising a cooling system to remove heat from the SOFC.

19. The SOFC of claim 17, comprising a layer of functionalized zeolite template carbon disposed at the interface between the anode and the SO, the interface between the cathode and the SO, or both.

20. The SOFC of claim 17, wherein the solid oxide electrolyte comprises yttria-stabilized zirconia (YSZ).

* * * * *

UNITED STATES PATENT AND TRADEMARK OFFICE
CERTIFICATE OF CORRECTION

| | |
|---|---|
| PATENT NO. | : 11,721,826 B2 |
| APPLICATION NO. | : 17/497521 |
| DATED | : August 8, 2023 |
| INVENTOR(S) | : Ahmad D. Hammad et al. |

It is certified that error appears in the above-identified patent and that said Letters Patent is hereby corrected as shown below:

On the Title Page

Column 2, (74) Attorney, Agent, or Firm, please replace "Richadson" with --Richardson--.

Signed and Sealed this
Twelfth Day of November, 2024

Katherine Kelly Vidal
*Director of the United States Patent and Trademark Office*